United States Patent [19]

Nagano

[11] Patent Number: 4,614,884
[45] Date of Patent: Sep. 30, 1986

[54] INPUT INTERFACE CIRCUIT AS A BUFFER OF A LOGIC DEVICE TO IMPROVE THE SIGNAL TO NOISE RATIO OF THE LOGIC DEVICE

[75] Inventor: Katsumi Nagano, Shimonoseki, Japan

[73] Assignee: Tokyo Shibaura Denki Kabushiki Kaisha, Kawasaki, Japan

[21] Appl. No.: 485,248

[22] Filed: Apr. 15, 1983

[30] Foreign Application Priority Data

Apr. 21, 1982 [JP] Japan ................................ 57-66615

[51] Int. Cl.⁴ .................... H03K 3/013; H03K 3/283; H03K 17/16; H03K 19/092
[52] U.S. Cl. .................................. 307/475; 307/443; 307/477; 307/593; 307/289
[58] Field of Search .................... 307/200 A, 443, 459, 307/454, 475, 477, 351, 362, 273, 276, 289, 290, 593, 299 B, 291

[56] References Cited

U.S. PATENT DOCUMENTS

| | | | |
|---|---|---|---|
| 3,129,344 | 4/1964 | Lemon, Jr. ...................... | 307/593 X |
| 3,259,854 | 7/1966 | Marcus et al. ................... | 307/593 X |
| 3,327,134 | 6/1967 | Keane ............................. | 307/593 X |
| 3,700,929 | 10/1972 | Frederiksen .................... | 307/299 B |
| 3,755,693 | 8/1973 | Lee ................................ | 307/270 |
| 3,846,647 | 11/1974 | Tanimoto ....................... | 307/273 |
| 4,115,711 | 9/1978 | Moussie .......................... | 307/350 |
| 4,259,601 | 3/1981 | Stein .............................. | 307/290 X |

FOREIGN PATENT DOCUMENTS 55-109033  8/1980  Japan ................................... 307/291

OTHER PUBLICATIONS

Radio Rernsehen Elektronik, vol. 28, No. 9, Sep. 1979, pp. 560-562, Berlin, DD; G. Turinsky: "Digitale Pegelwandler fur LSI- Schaltkreise".

Primary Examiner—Stanley D. Miller
Assistant Examiner—David R. Bertelson
Attorney, Agent, or Firm—Finnegan, Henderson, Farabow, Garrett & Dunner

[57] ABSTRACT

An input interface circuit for a logic device which has a first transistor whose base is supplied with an input signal and whose emitter is grounded through first and second resistors and a second transistor whose base is supplied with the potential of the node of the first and second resistors and whose collector sends forth a logic signal. This input interface circuit is further provided with a third resistor connected between the second resistor and ground and a third transistor whose current path is connected in parallel to the third resistor and whose base is connected to the collector of the second transistor.

15 Claims, 6 Drawing Figures

INPUT INTERFACE CIRCUIT AS A BUFFER OF A LOGIC DEVICE TO IMPROVE THE SIGNAL TO NOISE RATIO OF THE LOGIC DEVICE

BACKGROUND OF THE INVENTION

This invention relates to an input interface circuit for a logic device (e.g., an integrated injection logic device), and more particularly to an input interface circuit characterized by hysteresis.

Japanese Patent Disclosure (KOKAI) No. 54-102955 sets forth an input interface circuit for an integrated injection logic ($I^2L$) device. This interface circuit has a single threshold voltage which is designed to have a given level. However, the interface circuit is too sensitive to the ripples of an input signal caused by, for example, external noises.

Another Japanese Patent Disclosure (KOKAI) No. 51-130160 also discloses an input interface circuit. This interface circuit has first and second threshold voltages, and consequently an input signal to said interface circuit and an output signal therefrom are jointly characterized by hysteresis. The hysteresis characteristic suppresses the malfunction of the input interface circuit caused by external noises. However, the threshold voltage level of the interface circuit is governed by the characteristic of the transistor used, that is, the base-emitter voltage VBE and saturated collector voltage VCE (SAT) of the transistors. In other words, the threshold voltage level of said interface circuit is fixed at only two values "2VBE" and "VBE+VCE(SAT)". However, the available hysteresis is narrow (i.e., about 0.5 V). The disclosed interface circuit has a further drawback in that a low impedance is applied.

SUMMARY OF THE INVENTION

It is accordingly the object of this invention to provide an input interface circuit for a logic device, wherein a threshold voltage level and a hysteresis width can be freely chosen.

To attain the above-mentioned object, this invention provides an input interface circuit which comprises a series circuit of first and second resistive means; a current-supplying circuit for supplying the series circuit with current corresponding to the voltage level of an input signal, a logic signal-generating circuit for producing a logic signal corresponding to a voltage drop in the second resistive means, and a switching circuit which is connected to the series circuit to change the voltage drop of the second resistive means in response to an output logic signal from the logic signal-generating circuit.

The input interface circuit for a logic device embodying this invention has the advantages that the switching circuit which is connected to the second resistive means is rendered conductive or nonconductive as need arises by an output logic signal from the logic signal-generating curcuit which changes the voltage drop of the second resistive means, thereby varying the voltage level impressed on the logic signal-generating circuit. Therefore, a hysteresis characteristic can be attained between input and output signals of the input interface circuit. The first and second resistive means of the series circuit are chosen to have a proper resistive value or resistance so that high and low threshold voltages of the input interface circuit can be selectively set at proper voltage levels and also the width of the hysteresis can be adjusted.

DETAILED DESCRIPTION OF THE PREFERRED EMBODIMENTS

Figure 1:
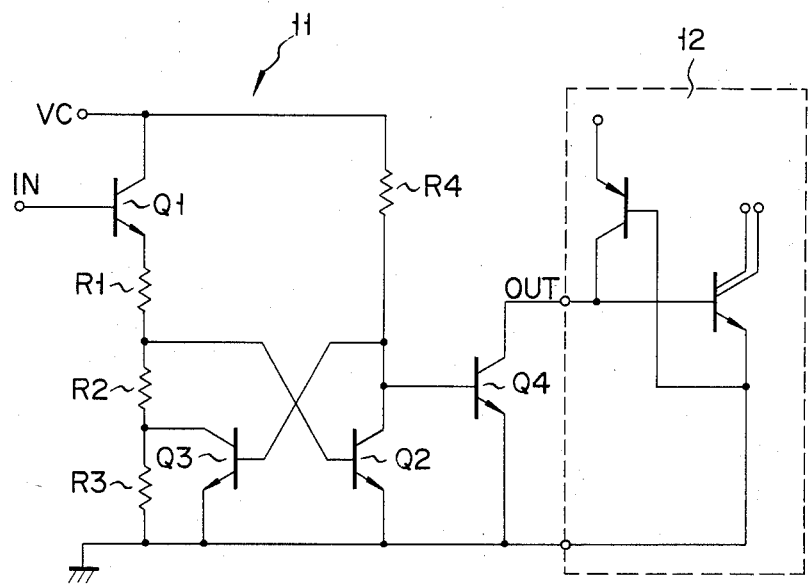
FIG. 1 indicates arrangement of an input interface circuit according to a first embodiment of this invention, which is connected to an integrated injection logic device.

FIG. 1 shows the arrangement of an input interface circuit 11 according to a first embodiment of this invention for a logic device, for example, an integrated injection logic device 12. The interface circuit 11 is provided with transistors Q1, Q2, Q3, Q4. The base of the transistor Q1 receives an input signal VI through an input terminal IN. The collector of the transistor Q1 is connected to a source terminal VC, and the emitter of the transistor Q1 is grounded through series-connected resistors R1, R2, R3. The transistor Q1 supplies current corresponding to the voltage level of the input signal VI to a series circuit including the resistors R1, R2, R3. The node of the resistors R1, R2 is connected to the base of the transistor Q2, whose emitter is grounded and whose collector is connected to the source terminal VC through a resistor R4. The switching or conduction state of the transistor Q2 is effected according to the extent of a voltage drop in a resistive circuit formed of the resistors R2, R3. The collector of the transistor Q2 acts as an output terminal for a logic signal. The collector of the transistor Q3 is connected to the node of the resistors R2, R3, and the emitter thereof is grounded. The transistor Q3 is rendered conductive or nonconductive according to the level ("H" or "L") of an output logic signal from the collector of the transistor Q2. The collector of the transistor Q2 is connected to the base of the transistor Q4, whose emitter is grounded and whose collector is connected to an output terminal OUT. The transistor Q4 inverts an ouput logic signal from the transistor Q2. The inverted logic signal is supplied to the logic device.

Description will now be given of the operation of an input interface circuit 11 according to a first embodiment of this invention. When an input signal VI to the circuit 11 has a low voltage level, for example, VI≃O[V], then the transistor Q1 receiving this input signal VI remains nonconductive. As a result, the transistor Q1 supplies substantially no current to the series circuit of the resistors R1, R2, R3. Little voltage, therefore, is applied on the base of the transistor Q2 from the resistive circuit of the resistors R2, R3, causing the transistor Q2 to remain nonconductive. Consequently, the transistors Q3, Q4 are supplied with high level voltage, i.e., a logic value "H", through the resistor R4. The voltage value "H" renders the transistor Q3 conductive, thereby reducing the resistance of the resistive circuit of the resistors R2, R3 substantially to a value effected by the resistor R2 alone. The above-mentioned voltage value "H" also renders the transistor Q4 conductive, thereby supplying a logic value "L" to the integrated injection logic device 12.

When the transistor Q1 is rendered conductive due to an increase in the voltage of the input signal VI, the transistor Q1 supplies the series circuit of the resistors R1, R2, R3 with current corresponding to the increase voltage level of the input signal VI. The base of the transistor Q2 is supplied with voltage corresponding to the voltage drop in the resistive circuit of the resistors R2, R3. In this case, the voltage drop is determined by current from the transistor Q1 and the resistance of resistor R2. The transistor Q2 is rendered conductive when a higher voltage than its base-emitter voltage VBE is applied on its base. This may be expressed by the following formula:

$$(VI - VBE)\frac{R2}{R1 + R2} \geq VBE, \quad (1)$$

where VBE denotes the base-emitter voltage of the transistors Q1, Q2. When the transistor Q2 is rendered conductive, the transistor Q4 is rendered nonconductive due to its base being grounded. As a result, a logic value "H" is supplied to the integrated injection logic device 12. The threshold level VTH of the interface circuit obtained when the input signal VI increase may be expressed by the following formula in which VI of the formula (1) is substituted by VTH:

$$VTH = \left(2 + \frac{R1}{R2}\right) VBE \quad (2)$$

When the voltage of the input signal VI exceeds the threshold level VTH of the formula (2), then the transistor Q2 is rendered conductive and the output logic value of the transistor Q4 is changed from "L" to "H". In this case, the transistor Q2 renders the transistor Q3 nonconductive by grounding its base. Thus, the resistive circuit of the resistors R2, R3 restores its orginal value equal to a sum of the resistance of the resistors R2, R3.

When the level of the input signal VI falls, the voltage drop in the resistive circuit of the resistors R2, R3 becomes small. Then, the transistor Q2 is rendered nonconductive when a voltage lower than its base-emitter voltage VBE is applied on its base. This event may be expressed by the following formula:

$$(VI - VBE)\frac{R2 + R3}{R1 + R2 + R3} \leq VBE \quad (3)$$

when the transistor Q2 is rendered nonconductive, the transistor Q4 has its base impressed with a high voltage, namely, a high logic value "H" to be rendered nonconductive, and sends forth a low logic value "L". The threshold level VTL of the interface circuit obtained when the input signal VI may be expressed by the following formula in which VI of the formula (3) is substituted by VTL.

$$VTL = \left(2 + \frac{R1}{R2 + R3}\right) VBE \quad (4)$$

In other words, when the input signal VI has a lower voltage than the threshold voltage VTL of the formula (3), an output logic value of the transistor Q4 is changed from "H" to "L". When the transistor Q2 is rendered nonconductive, the transistor Q3 has its base again impressed with a high voltage, namely, a high logic value "H" to be rendered conductive and substantially reduces the resistance of the resistive circuit of the resistors R2, R3.

Figure 2:
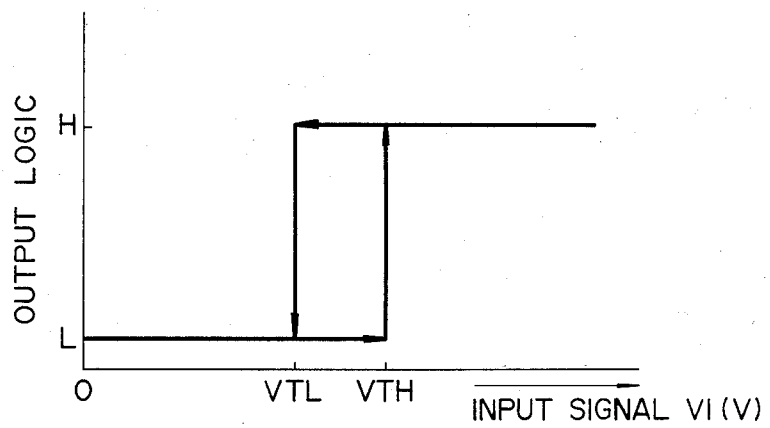
FIG. 2 graphically sets forth the characteristics of an input signal to the input interface circuit of FIG. 1 and an output signal therefrom.

The resistor R3 always has a positive value (R3>0), establishing the relationship of VTH>VTL. Therefore, an input signal VI to the input interface circuit 11 and an output logic signal therefrom define hysteresis shown in FIG. 2. The hysteresis width ΔVT may be given as:

$$\Delta VT = VTH - VTL = \left(\frac{1}{R2} - \frac{1}{R2 + R3}\right) R4VBE \quad (5)$$

With the subject interface circuit 11, threshold levels VTH, VTL and hysteresis width ΔVT can be defined by the resistance ratio of the resistors R1, R2, R3 as seen from the above-mentioned formulas.

The current IB of the input signal VI to the base of the transistor Q1 may be expressed by the following formula:

$$IB = \frac{VI - 2VBE}{\beta R1}, \quad (6)$$

where $\beta$ denotes a current-amplification factor of the emitter-grounded NPN transistor. If an input current IB is reduced by increasing the value of $\beta$, the interface circuit can have a high input impedance.

Figure 3:
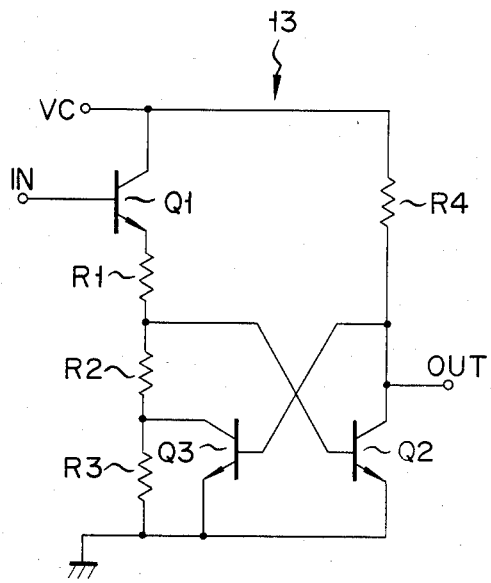
FIG. 3 indicates the arrangement of an inverting input interface circuit according to a second embodiment of the invention.

Description will now be given with reference to FIG. 3 of an inverting input interface circuit 13 according to a second embodiment of this invention. This input interface circuit is similar to that of FIG. 9 except that the transistor Q4 in FIG. 1 is omitted. The collector of the transistor Q2 is connected to the output terminal OUT.

The operation of the inverting interface circuit 13 will now be described with reference to the undermentioned experiments. Throughout the experiments the following values were used:

Resistor R1=R2=1 KΩ
Resistor R3=10 KΩ
Resistor R4=2.2 KΩ
Source voltage VC=5 V
Frequency F of input signal VI =10 KHz Theoretic value of threshold VTH=3VBE (about 2.1 V derived from the equation (2) . Theoretic value of threshold VTL=2.1VBE (about 1.5 V) derived from the equation (4).

The following actually determined threshold values substantially represent the originally designed results:
VTH=2.2 V
VTL=1.6 V The interface circuit 13 of FIG. 3 according to the second embodiment of the invention had a sufficiently simple arrangement to carry out speedy switching, and was operated under the normal condition when an input signal had a frequency F of 1 MHz. The subject interface circuit 13 made an extreme response to a triangular input having a frequency F of 1 MHz, namely indicated a rise time TR of 40 ns and a fall time TF of 60 ns.

Figure 4:
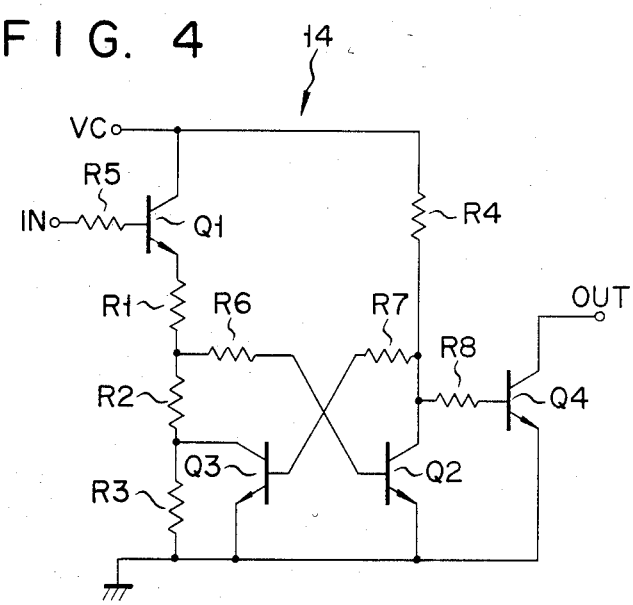
FIG. 4 sets forth the arrangement of an input interface circuit according to a third embodiment of the invention which is constructed by providing a resistor connected to the base of each transistor.

Description will now be given with reference to FIG. 4 of an input interface circuit 14 according to a third embodiment of the invention. The interface circuit 14 has substantially the same arrangement as the circuit 11 of FIG. 1 except that resistors R5 to R8 are provided ahead of the corresponding transistors Q1 to Q4. The resistor R5 protects the transistor Q1. The resistors R6 to R8 compensate for the unmatching of the VBE of the corresponding transistors. The above-mentioned arrangement assures the stable operation of the interface circuit.

Figure 5:
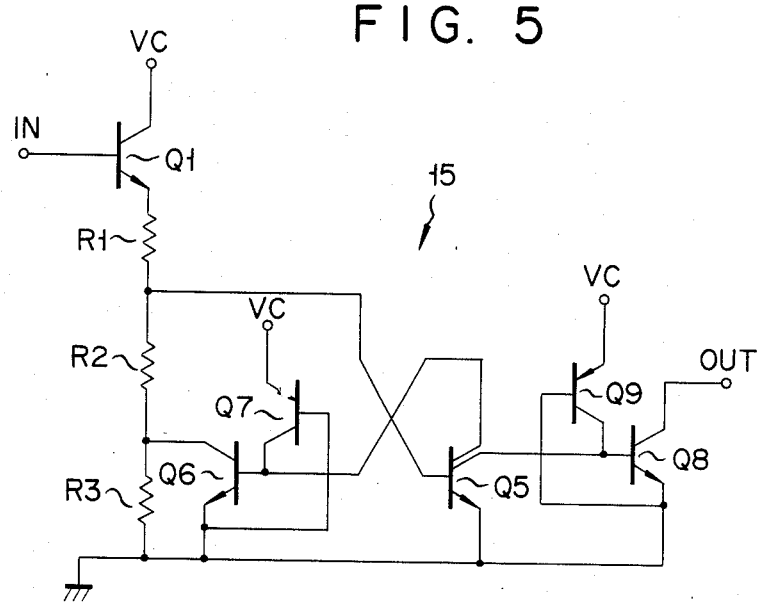
FIG. 5 shows the arrangement of an input interface circuit according to a fourth embodiment of the invention which is provided with integrated injection logic transistors.

Description will now be given with reference to FIG. 5 of an input interface circuit 15 according to a fourth embodiment of the invention. In this interface circuit 15, a multicollector type transistor Q5 substitutes for the transistor Q2 of the input interface circuit of FIG. 1. Transistors Q6, Q7 constituting an integrated injection logic circuit of FIG. 5 substitute for the transistor Q3 of FIG. 1. Transistors Q8, Q9 constituting an integrated logic circuit of FIG. 5 substitute for the transistor Q4 of FIG. 1. The bases of the transistors Q6, Q8 are connected to the collectors of the transistor Q5, from which a logic signal is directly supplied to the bases of the transistors Q6, Q8. The input interface circuit 15 ensures the same effect as the interface circuit 11 of FIG. 1, though the resistor R4 required for FIG. 1 is omitted.

Figure 6:
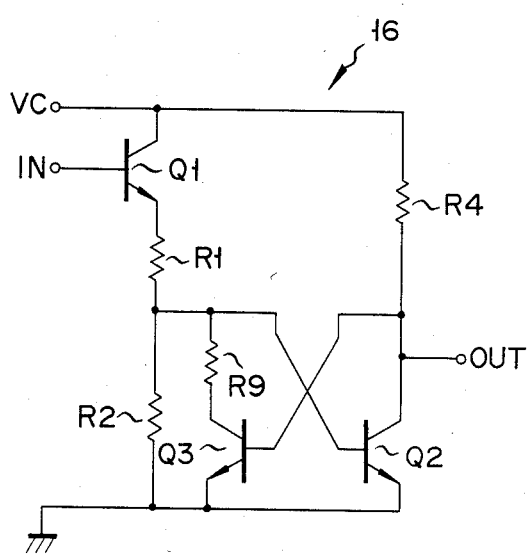
FIG. 6 indicates the arrangement of an input interface circuit according to a fifth embodiment of the invention.

Description will now be given with reference to FIG. 6 of an input interface circuit 16 according to a fifth embodiment of this invention. A series circuit of the resistor R9 and transistor Q3 is connected in parallel to the resistor R2. With this fifth embodiment, when the transistor Q3 is rendered nonconductive, the base of the transistor Q2 is impressed with such level of voltage as corresponds to the value of the ratio between the resistances of the resistors R1, R2

$$\left(\text{that is,} \frac{R2}{R1 + R2}\right).$$

When the transistor Q3 is rendered conductive, the base of the transistor Q2 is impressed with such level of voltage as corresponds to the value of the ratio between the resistances of the parallel circuit of the resistors R2, R9 and that of the resistor $$\left(\text{that is,} \frac{R2R9}{R2R9 + R1(R2 + R9)}\right).$$

As mentioned above, the threshold level of the interface circuits 11, 13, 14, 15, 16 and the hysteresis width can be freely preset by changing the resistive value of the resistors R1, R2, R3, R9. The present invention can provide an input interface circuit having a high impedance by elevating the current-amplification factor of transistors.

It will be noted that this invention is not limited to the foregoing embodiments, but is applicable with various changes and modifications. For instance, it is possible to connect a bias resistor to the base of the transistor Q1 included in the subject input interface circuit 11 of FIG.

1. The resistors R1, R2, R3, R9 may be substituted by variable resistors. Also, the resistors R1, R2, R3, may be substituted by MOS transistors.

What is claimed is:

1. An input interface circuit as a buffer of a logic device to improve the signal to noise ratio of the logic device comprising:

first and second potential terminals between which a power source voltage is applied;

variable resistive means having a control terminal for receiving first and second mode signals, said variable resistive means being set at a first resistance in response to a first mode signal and at a second resistance in response to a second mode signal, said first resistance being higher than that of said second resistance;

current-supplying means connected in series with said variable resistive means between said first and second potential terminals, having an input terminal for receiving an input voltage signal, and supplying a current corresponding to the input voltage signal to said variable resistive means; and signal-generating means having switching means which has a control terminal connected to receive a control voltage proportional to the voltage drop across said variable resistive means and whose conduction state is controlled by the control voltage, which said signal-generating means generates an output signal of a first logic level when said switching means is conductive and that of a second logic level when said switching means is nonconductive, and supplies said output signal of the first and second logic levels respectively as said first and second mode signals to the control terminal of said variable resistive means.

2. An input interface circuit according to claim 1, wherein said signal-generating means includes a first resistor and a first transistor which has a base connected to the junction of said current-supplying means and said variable resistive means, a collector connected to said first potential terminal through said first resistor, and an emitter connected to said second potential terminal; and the collector of said first transistor acts as an output terminal for said output signal.

3. An input interface circuit according to claim 2, wherein said current-supplying means includes a second resistor and a second transistor which has a base for receiving said input voltage signal, a collector connected to said first potential terminal, and an emitter connected to one end of said second resistor, the other end of said second resistor being connected to said second potential terminal through said variable resistive means.

4. An input interface circuit according to claim 3, wherein said variable resistive means includes a third resistor connected at one end to the other end of said second resistor, a fourth resistor connected at one end to the other end of said third resistor and at the other end to said second potential terminal, and a third transistor which has a base connected to the collector of said first transistor, a collector connected to the junction of the third and fourth resistors, and an emitter connected to the other end of said fourth resistor.

5. An input interface circuit according to claim 4, wherein said current-supplying means further includes a fifth resistor connected between the base of said second transistor and the input terminal of said current-supplying means.

6. An input interface circuit according to claim 5, wherein said signal-generating means further includes a sixth resistor connected between the base of said first transistor and the junction of said second and third resistors; and said variable resistive means further includes a seventh resistor connected between the base of said third transistor and the collector of said first transistor.

7. An input interface circuit according to claim 3, wherein said variable resistive means includes a third resistor connected at one end to the other end of said second resistor and at the other end to said second potential terminal, a fourth resistor, and a third transistor which has a base connected to the collector of said first transistor, a collector connected to the junction of the second and third resistors through said fourth resistor, and an emitter connected to the other end of said third resistor.

8. An input interface circuit according to claim 1, wherein said variable resistive means includes a first resistor, a second resistor connected in series with said first resistor between said current-supplying means and said second potential terminal, and a second switching means which is connected in parallel to said second resistor and rendered conductive in response to said second mode signal.

9. An input interface circuit according to claim 1, wherein said variable resistive means includes a first resistor connected between said current-supplying means and said second potential terminal, a second resistor, and a second switching means which is connected in parallel to said first resistor through said second resistor and rendered conductive in response to said second mode signal.

10. An input interface circuit according to claim 1, further comprising an inverting means, connected to the signal generating means for inverting the output signal of the signal generating means, which includes second switching means whose conduction state is controlled by the output signal of said signal-generating means.

11. An input interference circuit according to claim 10, wherein said resistive means has a transistor which has a base connected to receive the output signal of said signal-generating means, an emitter connected to said second potential terminal, and collector connected to an output terminal.

12. An input interface circuit according to claim 11, wherein said resistive means further has a resistor through which the output signal of said signal-generating means is supplied to the base of said transistor.

13. An input interface circuit as a buffer of an integrated injection logic (IIL) device to improve the signal to noise ratio of the IIL device comprising:

first and second potential terminals between which a power source voltage is applied;
variable resistive means having a control terminal for receiving first and second mode signals, said variable resistive means being set at a first resistance in response to a first mode signal and at a second resistance in response to a second mode signal, said first resistance being higher than that of said second resistance;
current-supplying means connected in series with said variable resistive means between said first and second potential terminals, having an input terminal for receiving an input voltage signal, and supplying a current corresponding to the input voltage signal to said variable resistive means; and
signal-generating means having switching means which has a control terminal connected to receive a control voltage proportional to the voltage drop across said variable resistive means and whose conduction state is controlled by the control voltage, which said signal-generating means generates first and second output signals of a first logic level when said switching means is conductive and the first and second output signals of a second logic level when said switching means is nonconductive, and supplies said first output signal of the first and second logic levels as said first and second mode signals to the control terminal of said variable resistive means.

14. An input interface circuit according to claim 13, wherein said signal generating means includes a multicollector type transistor which has a base connected to the junction of said current-supplying means and said variable resistive means, an emitter connected to said second potential terminal, and first and second collectors; said variable resistive means includes a first resistive means connected at one end to said first potential terminal through said current supplying means, a second resistor connected at one end to the other end of said first resistor and at the other end to said second potential terminal, a second transistor which has a base connected to the first collector of said multicollector type transistor, a collector connected to the junction of the first and second resistors, and an emitter connected to the other end of said second resistor, and a third transistor which has a base connected to the emitter of said second transistor, a collector connected to the base of said second transistor, and an emitter connected to said first potential terminal, and constitutes an integrated injection logic circuit together with said second transistor; the second collector of said multicollector type transistor acting as an output terminal for said second output signal.

15. An input interface circuit according to claim 14, further comprising an inverting means which includes a fourth transistor having a base connected to the second collector of said multicollector type transistor, a collector acting as a second output terminal, and an emitter connected to said second potential terminal, and a fifth transistor having a base connected to the emitter of said fourth transistor, a collector connected to the base of said fourth transistor, and an emitter connected to said first potential terminal, said fourth and fifth transistors constituting an integrated injection logic circuit.

* * * * *